United States Patent [19]

Bordiec

[11] Patent Number: 5,377,137
[45] Date of Patent: Dec. 27, 1994

[54] READ-PROTECTED SEMICONDUCTOR PROGRAM MEMORY

[75] Inventor: René Bordiec, Nantes, France
[73] Assignee: Matra MHS, Nantes, France
[21] Appl. No.: 117,761
[22] Filed: Sep. 8, 1993
[30] Foreign Application Priority Data Sep. 16, 1992 [FR] France ................. 92 11031

[51] Int. Cl.$^5$ .............................................. G06F 12/14
[52] U.S. Cl. .................... 365/94; 365/195; 380/50
[58] Field of Search ............... 365/104, 195, 196, 94, 365/103; 235/492, 380; 380/49, 50

[56] References Cited

U.S. PATENT DOCUMENTS

| | | |
|---|---|---|
| 4,318,014 | 3/1982 | McAlister . |
| 4,771,462 | 9/1988 | Hannan et al. ............ 380/50 |
| 4,987,595 | 2/1991 | Marino, Jr. et al. ............ 380/50 |
| 5,131,091 | 7/1992 | Mizuta . |

FOREIGN PATENT DOCUMENTS

| | | |
|---|---|---|
| 0040045 | 11/1981 | European Pat. Off. . |
| 0131151 | 1/1985 | European Pat. Off. . |
| 0348895 | 1/1990 | European Pat. Off. . |

OTHER PUBLICATIONS

IBM Technical Disclosure Bulletin, vol. 19, NO. 11, Apr. 1977, pp. 4197-4198, "Word-Line Failure Detection Circuit", by E. C. Jacobson.
Patent Abstracts of Japan, vol. 9, No. 50 (P-339), Mar. 5, 1985 & JP-A-59 188 897 (Hitachi).

Primary Examiner—Eugene R. LaRoche
Assistant Examiner—Vu Le
Attorney, Agent, or Firm—Larson & Taylor

[57] ABSTRACT

A read protected semi-conductor program memory that can be used for protection of read-only memories built in microhandler of microcomputers comprising a first program memory area intended for storing the program data and a second encryption memory area intended for storing encryption data. A logical operator in intercoupled with the program and encryption memory areas making thus possible, on simultaneous reading of the program and encryption memory areas, to obtain encrypted program data.

10 Claims, 6 Drawing Sheets

SWITCH CLOSED FOR CHECKING THE PROGRAM
OPEN FOR EXECUTING

READ-PROTECTED SEMICONDUCTOR PROGRAM MEMORY

The present invention relates to a read-protected semiconductor program memory.

Semiconductor program memories, of read-only memory type, are currently widely used, by virtue of their reliability and their level of integration of the corresponding circuits.

Figure 1A:
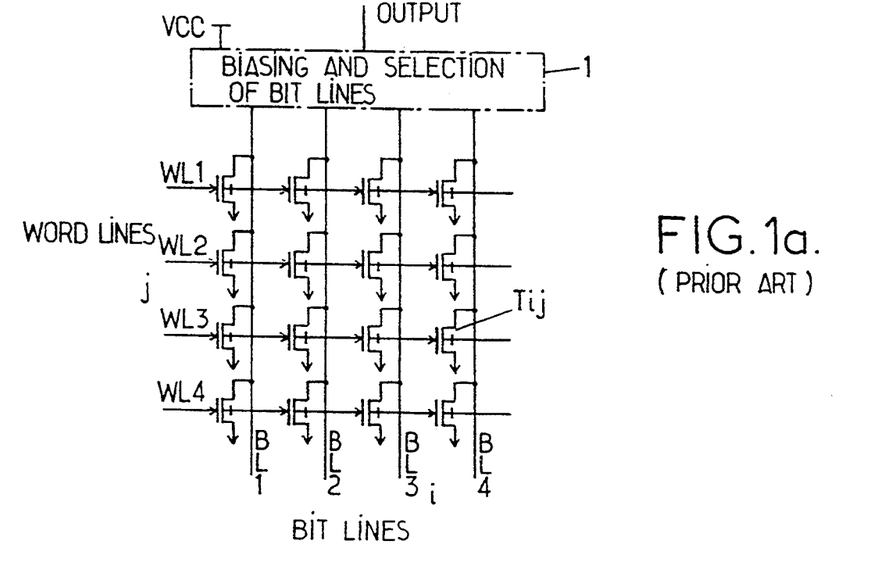

Represented in FIG. 1a is a semiconductor memory device of conventional read-only memory type, consisting of transistors of type N for example, these transistors, denoted $T_{ij}$ being arranged and addressed in matrix form as rows and columns. The number of memory locations, wherein a logical variable can be stored, is the product $m \times n$ of the number of rows m times the number of columns n.

The gates of the transistors of any one row are connected electrically to a word line, $WL_1$ to $WL_4$, and the transistors of any one column are connected to a bit line, $BL_1$ to $BL_4$, biased to the high state, logic level 1.

The programing of the memory locations then consists in isolating these transistors from the bit line according to the logic level desired, 1 or 0. This operation is carried out at a specific manufacturing level, the metal level generally.

Thus, an N-transistor situated on a selected word line, by read-addressing, causes the downloading of the bit line to the low state, logic level 0, if the drain of this transistor is coupled to this bit line, the source of the transistor being coupled to the supply voltage Vss.

Figure 1B:
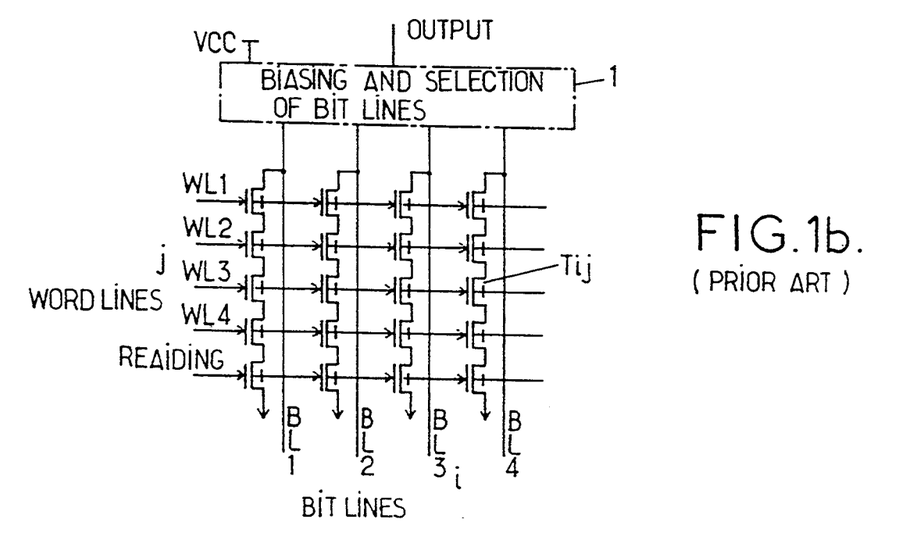

Represented in FIG. 1b is a memory device in which the N-transistors of the same column are intercoupled in series, in such a way that just one of them is connected to a bit line. All the N-transistors of the same row have their gate coupled to a word line and all the word lines are biased to the high state, logic value 1, except the one which is selected, by read-addressing. An N-transistor whose gate is coupled to the aforesaid line goes to the blocked state, thus prohibiting the downloading of the bit line, and therefore determining a 1 programing level. The programing of a 0 programing level is obtained by short-circuiting drain and source at the metal level, or by depleting this transistor, so as to allow the downloading of the bit line.

Figure 1C:
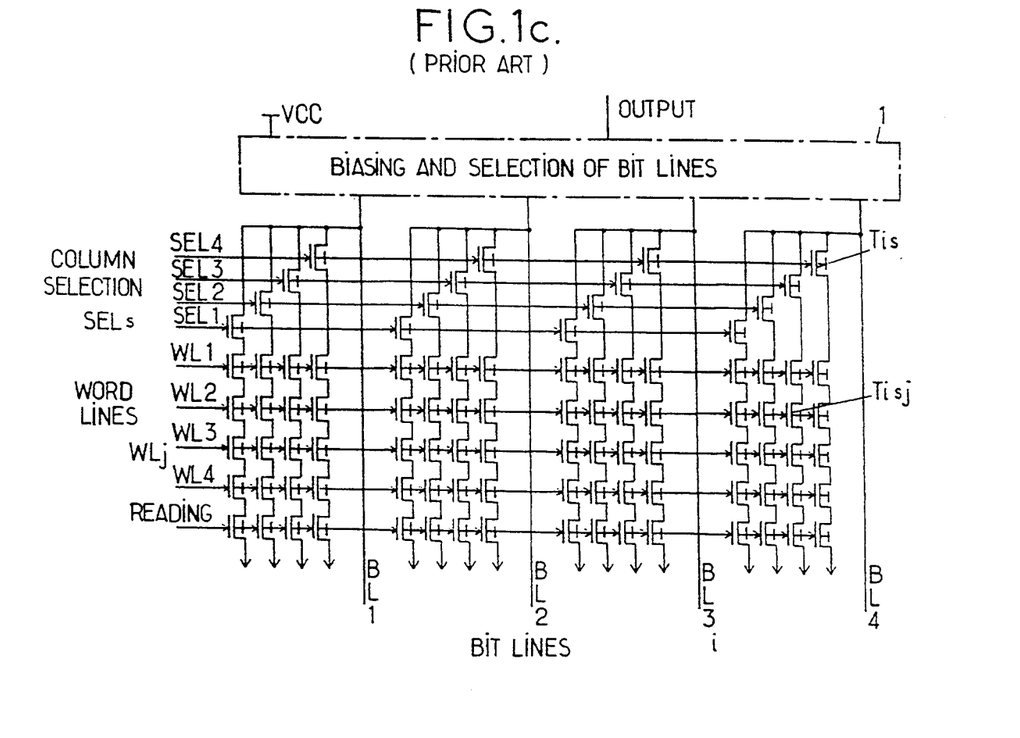

Lastly, FIG. 1c represents a memory device derived from the device represented in FIG. 1b, and in which several columns are connected to the same bit line by N-transistors for access or for selection, denoted $T_{is}$, controlled by selection lines $SEL_1$ to $SEL_4$, so that only one of these columns is coupled to the aforesaid bit line. All the access transistors of the same row have their gate coupled to the same selection line, the storage transistors being denoted $T_{isj}$.

This type of read-only memory is entirely satisfactory, from the point of view of its operation. However, sequential physical access to the bit lines and word lines allows direct reading of the program or of the stored data, without any possibility of obstructing unwanted attempts of this type, the software or hardware protection levels likely to be envisaged not in any case being effective in the case of direct access.

The object of the present invention is to remedy the aforesaid disadvantage, so as to eliminate any risk of reading by external direct access to the memory programs and to the stored data.

Another object of the present invention is also the implementation of a system for external read-protection of a semiconductor program memory, of read-only memory type, which is completely indiscernible through visual or optical observation of the storage circuits proper.

Lastly, another object of the present invention is the implementation of a system for external read-protection of a semiconductor program memory, of read-only memory type, by. encryption, by which any external access in respect of unauthorized profitable reading requires both a knowledge of the contents of the encryption data and of the matrix layout of the cells making up the program memory, that is to say of the stored data or stored executable program.

The read-protected semiconductor program memory of read-only memory type which is the subject of the present invention, is notable in that it includes a first program memory area intended for storing the program data, and a second encryption memory area intended for storing the encryption data. A logical operator intercoupled with the program memory area and with the encryption memory area makes it possible, on simultaneous reading of the program respectively encryption memory areas, to obtain encrypted program data.

The invention is of application to the protection of ROM or EPROM type semiconductor read-only memories, in particular for the production of microhandlers or microcomputers.

The invention will be better understood on reading the description and on looking at the drawings below in which, apart from FIGS. 1a through 1c relating to the prior art.

A more detailed description of a read-protected, read-only memory type, semi-conductor program memory in accordance with the subject of the present invention will now be given in connection with FIGS. 2a et seq.

Figure 2A:
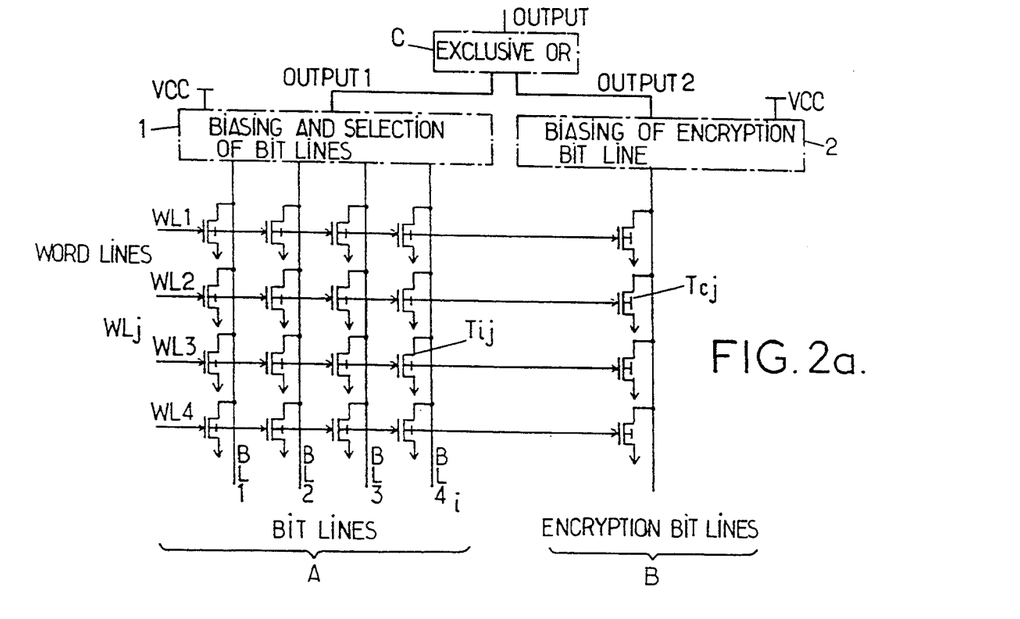
FIG. 2a represents a general view of a read-protected semi-conductor program memory in accordance with the subject of the present invention.

In FIG. 2a it can be seen that the program memory of the present invention includes a first program memory area, denoted A, intended for storing the program data, and a second encryption memory area, denoted B, intended for storing the encryption data. It is of course understood that the areas A and B actually include transistors installed in a matrix topography, these transistors being connected respectively to a circuit 1 for biasing and for selecting bit lines and 2 for biasing the encryption bit line.

Furthermore, a logical operator, denoted C, is intercoupled with the program memory area A and encryption memory area B and makes it possible, on simultaneous reading of the aforesaid memory areas, to obtain encrypted program data at the output. It is of course understood that the logical operator C is thus connected, at two of its inputs, to the output 1 of the circuit for biasing and selecting bit lines 1, respectively to the output 2 of the circuit for biasing the encryption bit line 2.

As represented in FIG. 2a, the first program memory area A consists of a network of transistors of MOS type, these transistors, being denoted $T_{ij}$, laid out in matrix form by row J and column i. Thus, a row includes at least one word line, $WL_j$, and a column includes at least one bit line, $BL_i$. The second encryption memory area B comprises an encryption bit line. It is of course understood that, in FIG. 2a, the memory area A represented relates to one bit, the second encryption memory area B then including the additional encryption bit line, as will be described in more detail in the description.

In FIG. 2a, it will be observed that the encryption bit line is formed of transistors, denoted $Tc_j$, which are coupled to the encryption bit line, and are of like type and identical in number to those coupled to the bit lines of the first program memory area A.

On looking at FIG. 2a it will also be seen that for a network of MOS transistors in which the gates of the transistors $T_{ij}$ of any one row are connected to a word line, $WL_j$, and the drains of the transistors of any one column are connected to a bit line, $BL_i$, the second encryption memory area consists of the MOS transistors, $Tc_j$, described previously, of like type and identical in number, the drains of which are coupled to an encryption bit line and the gates to the word lines $WL_j$.

Figure 2B:
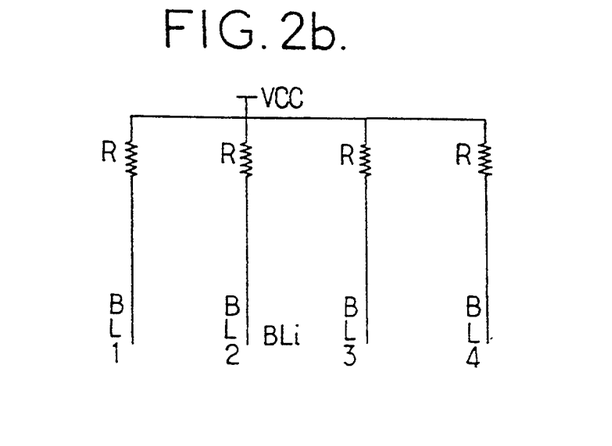
FIGS. 2b through 2d represent various illustrative embodiments of systems for biasing bit lines of the program memory according to the invention as represented in FIG. 2a, FIG. 3 represents a first variant embodiment of the configuration of the read-protected semi-conductor program memory as represented in FIG. 2a, FIG. 4 represents a second variant embodiment of the configuration of the read-protected semi-conductor program memory as represented in FIG. 2a, FIG. 5 represents a diagram of installation, in the form of an integrated circuit, of a read-protected semi-conductor program memory according to the invention, for a memory capacity of $n \times m$ words of k bits.
Figure 2C:
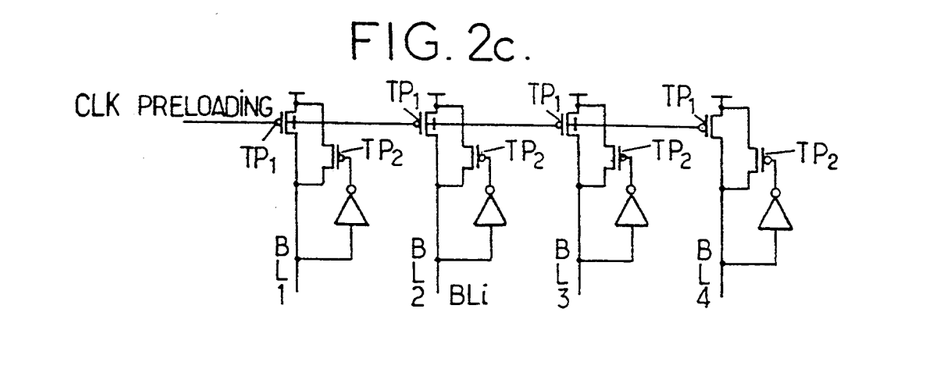
Figure 2D:
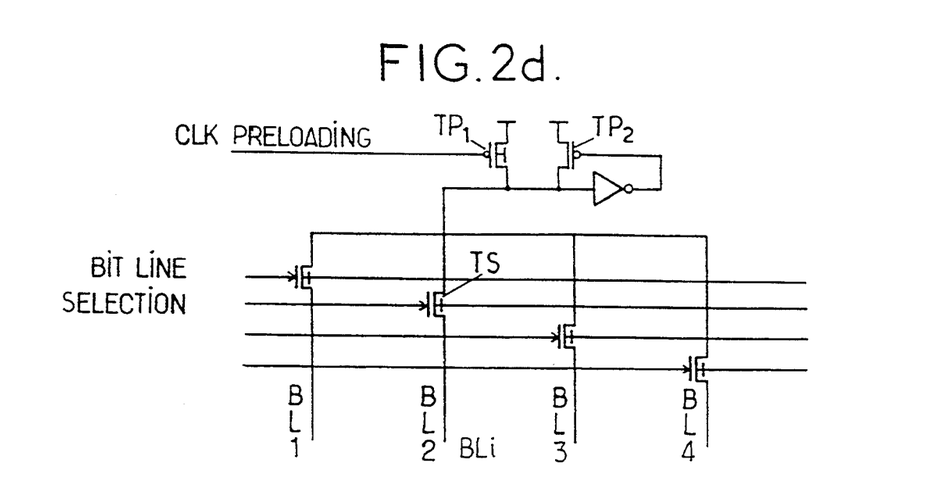

Various embodiments of the circuits 1 and 2 for biasing and selecting bit lines are represented in FIGS. 2b through 2d.

As represented in FIG. 2b, the bit lines are biased by the aforesaid circuits, and are therefore held in the high state by resistors R coupled to the supply voltage, VCC, for example.

As represented in FIG. 2c, they may be preloaded by P-transistors, denoted $TP_1$ and $TP_2$ in FIG. 2c, to the "0" logic level of a clock signal CLK, and self-held in the "1" logic state by the P-type transistors, having a high drain-source resistance, and denoted $TP_2$ in FIG. 2c, to the opposite logic level of the clock signal CLK.

However, the preloading system, as represented in FIG. 2d, can be common to several bit lines. In this case, the preloading is selective, which makes it possible to reduce the dynamic consumption of electrical energy, a single bit line being preloaded during a reading cycle, as represented in FIG. 2d, selection of the bit lines then being sequential.

The link between the common preloading circuit and the bit lines is then effected by the selection transistors, denoted TS in FIG. 2d.

It is of course understood that the circuit 2 for biasing the encryption bit line can be produced in a manner similar to the embodiment represented in FIGS. 2b through 2d relating to the circuit 1 for biasing and selecting bit lines.

Figure 3:
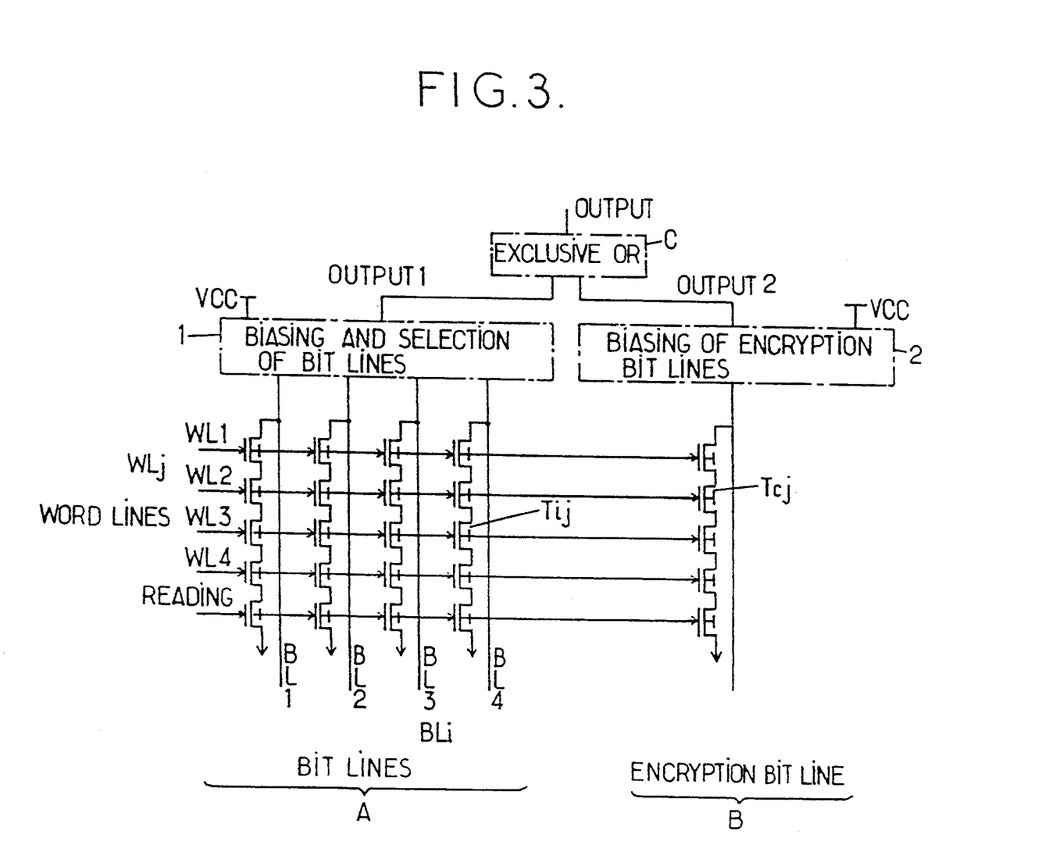

Represented in FIG. 3 is a first variant embodiment of the read-protected semi-conductor program memory in accordance with the subject of the present invention, as represented in FIG. 2a.

In the case of the aforesaid FIG. 3, for a network of MOS transistors of the first program memory area A in which the MOS transistors of any one column are coupled in series, one of these transistors, the leading transistor, being connected to a bit line, $BL_i$, and all the transistors of any one row having their gate coupled to the same word line, $WL_j$, the second memory, or encryption memory area B, consists of series transistors, denoted $Tc_j$, of like type and identical in number to the number of transistors constituting the transistor columns associated with each bit line, the second encryption memory being coupled to an encryption bit line, in a manner similar to the embodiment of FIG. 2a.

Figure 4:
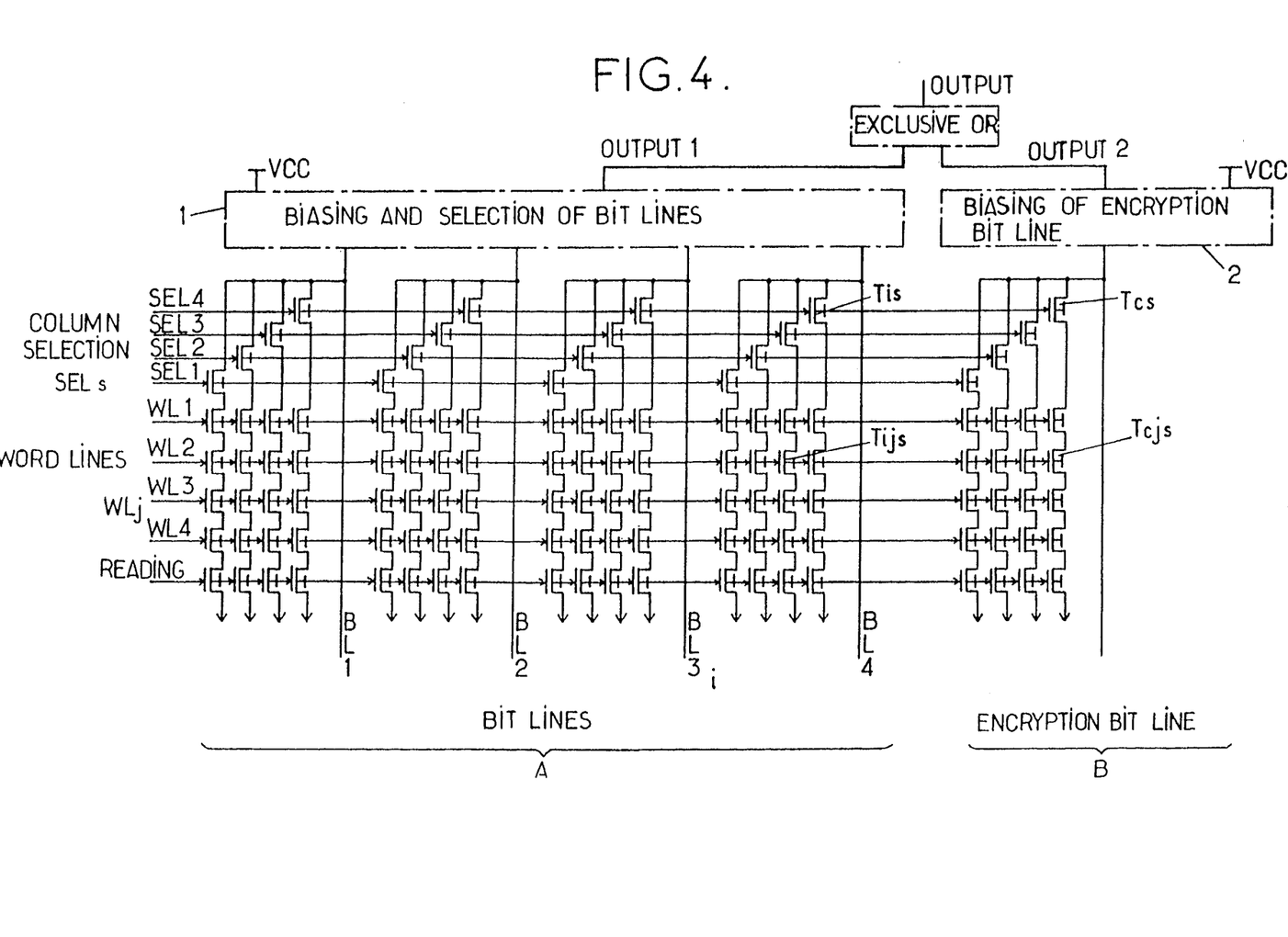

Finally, in a second variant embodiment as represented in FIG. 4, for a network of MOS transistors of the first memory area A, in which network a plurality, s, of columns of transistors, $T_{isj}$, are connected to the same bit line, $BL_i$, by way of access transistors, $T_{is}$, configured as access lines each controlled by a selection line, $SEL_s$, a single column being electrically coupled on the command of a column selection signal to the bit line, whilst the other columns connected to this bit line are electrically uncoupled from it, all the access transistors, $T_{is}$, of any one access line have their gate coupled to the same selection line, $SEL_s$, and the second encryption memory area B is formed of one plurality of columns of transistors, $Tc_{js}$, coupled to an encryption bit line. It is of course understood that in the context of FIG. 4, the memory areas A and B also relate to the memory areas of a bit of given rank, access to a specified column of rank s thus being controlled sequentially by the column selection lines, $SEL_s$, thereby allowing more bits of like rank to be stored in this way, and ultimately more words to be stored, as will be described subsequently in the description, while simultaneously reducing the consumption of electrical power supply.

The circuits for biasing and selecting the bit lines 1 and encryption bit line 2 are identical to those represented in FIG. 2a or 3.

Figure 5:
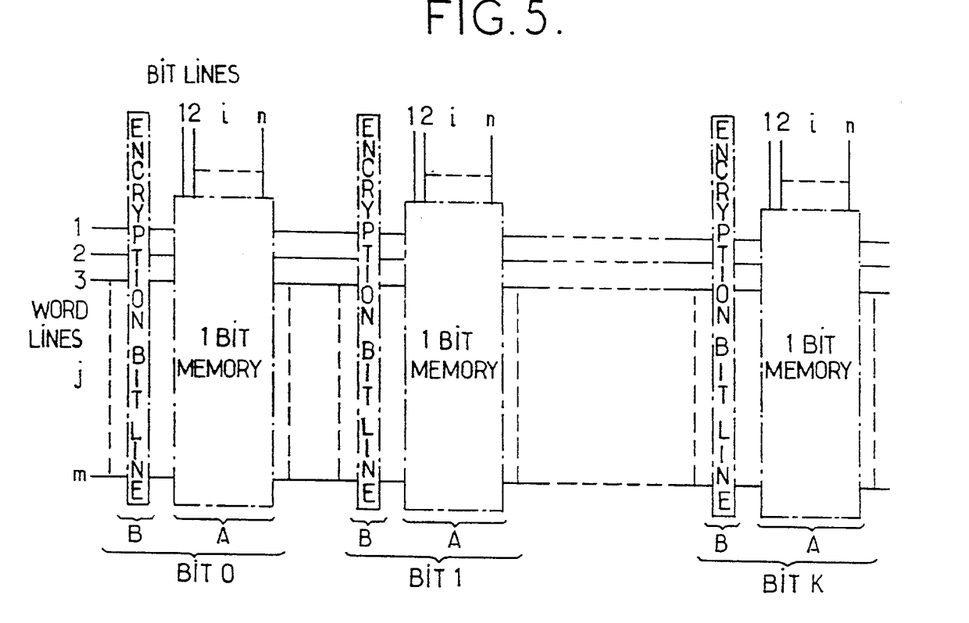

Represented in FIG. 5 is a diagram for the integrated-circuit installation of one or other of the variant embodiments of the read-protected semi-conductor program memory which is the subject of the present invention, as represented in FIGS. 2a, 3 or 4.

Of course, it is understood that the second memory area B can be installed equally well to the right or to the left of the first program memory area A.

For words coded on k bits, and as represented in FIG. 5 for each bit of corresponding rank, the protected program memory circuit according to the subject of the present invention comprises, for each bit, the memory areas A and B described earlier in the description. In FIG. 5, the circuits for biasing and selecting bit lines, respectively encryption bit lines 1, 2, have not been represented, so as not to overload the drawing. It is thus understood that for matrix networks making up first, A, and second, B, memory areas, which matrix networks possess, as represented in FIG. 5, m rows and n columns, and for k pairs of memory areas A, B thus installed, a memory with capacity m×n words of k bits is obtained.

It is furthermore understood that the encryption bit line(s) and the transistors making up at least one corresponding column of the encryption bit line of the second encryption memory area B are thus integrated with the network of transistors of bit lines of the first memory area A, each transistor of one or more columns of the encryption bit line having its gate coupled to the gates of the transistors of the first data memory area belonging to the same row, by way of a single word line.

It is likewise understood that the fact that the second memory area B is constructed in an identical manner from the point of view of the semi-conductor architecture to the bit lines or at the very least to the columns associated with the corresponding bit line of the first memory area A, makes it possible of course to render the encryption memory and the program memory, that is to say areas B and A, indiscernible from one another by optical means of observation.

Thus, as furthermore represented in all the figures from 2a onwards, the logical operator C can consist of an operator of exclusive OR type.

The algorithm for pointing inside the encryption memory can be determined by address bit combinations of the corresponding program memory. Thus, unauthorized access and pirating of the program code stored in memory area A requires a knowledge of both the contents of the encryption table and the architecture of the matrix making up the first memory area A.

For the purpose of encrypting the data, logical operators other than the exclusive OR may be used. However, the exclusive OR offers, owing to the uniqueness of the encryption solution realized, as described in the table below, the best result by virtue of the simplicity of the corresponding function obtained by implementing this operator.

| EXCLUSIVE-OR | | |
|---|---|---|
| X | Y | S |
| 0 | 0 | 0 |
| 0 | 1 | 1 |
| 1 | 0 | 1 |
| 1 | 1 | 0 |

X being the datum from the main memory,
Y being the datum from the encryption memory,
S being the encrypted datum.

It is of course understood, on looking at this same FIG. 5, that for a field of data coded on k bits, in k-bit words, the logical operator comprises k elementary exclusive OR operators in order to deliver the encrypted datum.

Figure 6:
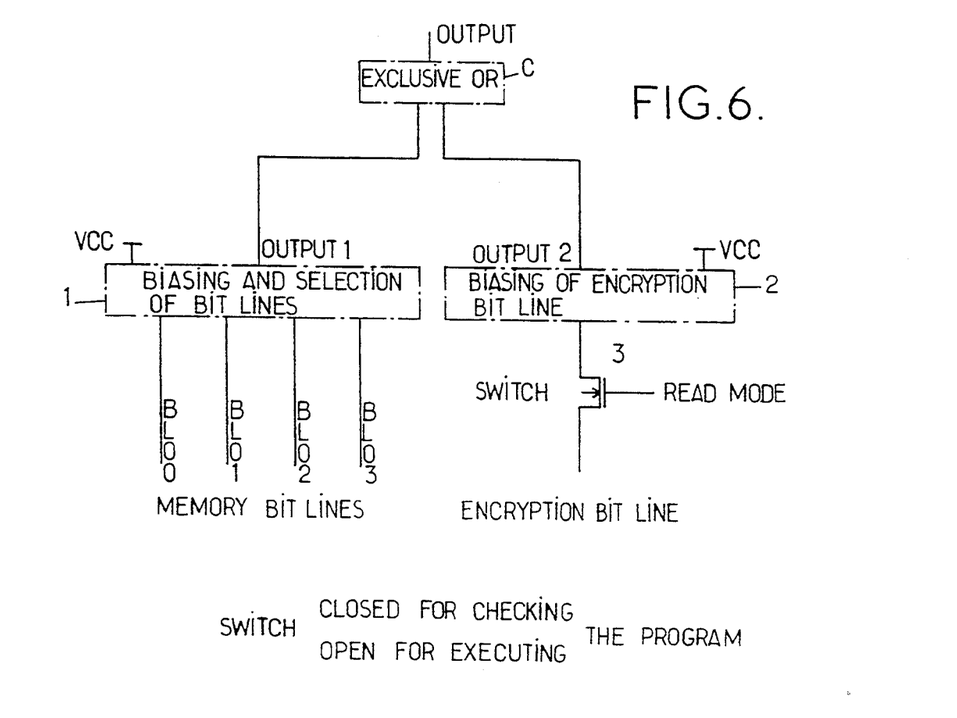
FIG. 6 represents a variant embodiment of FIGS. 2a, 3 and 4, in an application more particularly intended for a microhandler or microcomputer.

FIG. 6 represents one particular application of an embodiment of a memory according to the subject of the present invention, more particularly adapted to the use of a microhandler or of a microcomputer.

As will be observed on looking at FIG. 6, a switch 3 is inserted between the circuit 2 for biasing the encryption bit line and the encryption bit line proper. This switch 3 can be produced with an N-type transistor capable of effecting switching between a state for checking and for executing the program.

If the program memory contains an executable code, as in the case of a microhandler for example, the switch mechanism described earlier makes it possible to isolate each encryption bit line when the reading of the memory occurs within one cycle of execution of the program. Indeed, only the reading of the code from outside need be locked out, so as to guarantee protection from pirating of the software stored in the program memory.

A read-protected semi-conductor program memory of read-only memory type which is particularly advantageous insofar as the pirating of the program memories can be prevented, has thus been described. This result is achieved through the fact that the program memory and the encryption memory are customized simultaneously, thus ensuring the uniqueness of the protection and guaranteeing the confidentiality of the data stored in the program memory area.

I claim:

1. A read-protected semiconductor program memory of read-only type, including a first (A) program memory area intended for storing program data, and a second (B) encryption memory area intended for storing encryption data, said first (A) program memory area comprising a network of MOS transistors ($T_{ij}$) laid out in matrix form with rows (j) and columns (i), a row including at least one word line and a column including at least one bit line, said second (B) encryption memory area comprising a bit line including a network of MOS transistors ($Tc_j$), laid out in matrix form with rows (j), the gates of said MOS transistors forming said network of said bit line being connected to the corresponding word line, said memory including a logical operator (C) intercoupled with said first program memory area and said second encryption memory area and making it possible, on simultaneous reading of said program respectively encryption memory areas, to obtain encrypted program data.

2. The memory as claimed in claim 1, wherein for a network of MOS transistors in which the gates of the transistors ($T_{ij}$) of any one row are connected to the same word line ($WL_j$), and the drains of the said transistors of any one column are connected to a bit line ($BL_i$), the said second encryption memory consists of MOS transistors of like type ($Tc_j$) coupled to an encryption bit line and identical in number to the MOS transistors of the data memory area, coupled to the corresponding bit lines.

3. The memory as claimed in claim 1, wherein for a network of MOS transistors of the first (A) memory in which the MOS transistors of any one column are coupled in series, one of these transistors being connected to a bit line ($BL_i$), and all the transistors of any one row having their gate coupled to the same word line ($WL_j$), the said second encryption memory consists of series transistors ($Tc_j$) of like type and identical in number to the number of transistors constituting said columns, the said second encryption memory being coupled to an encryption bit line.

4. The memory as claimed in claim 1, wherein for a network of MOS transistors of the first (A) memory area, in which network a plurality (is) of columns of transistors ($T_{isj}$) are connected to the same bit line ($BL_i$) by way of access transistors ($T_{is}$) configured as access lines each controlled by a selection line ($SEL_s$), a single column being electrically coupled to said bit line while the other columns connected to this bit line are electrically uncoupled from it, and all the access transistors ($T_{is}$) of any one access line having a gate coupled to the same selection line ($SEL_s$), said second encryption memory area (B) is formed of a plurality of columns of transistors ($TC_{js}$) coupled to an encryption bit line by way of said access transistors.

5. The memory as claimed in claim 1, wherein each encryption bit line of the second encryption memory area includes a preloading system and a system for biasing of the same type as that of the other bit lines of the first program memory area.

6. The memory as claimed in claim 1, wherein said encryption bit line and the transistors making up the corresponding column of said encryption bit line of said second encryption memory area are integrated with the network of transistors of the bit lines of the first memory area, each transistor of said encryption bit line having its gate coupled to the gates of the transistors of the first program memory area belonging to the same row, by way of the single word line.

7. The memory as claimed in claim 1, wherein, for a data field coded in k-bit words, each bit of corresponding rank comprises a memory area (A) and a memory area (B).

8. The memory as claimed in claim 1, wherein said logical operator (C) is an exclusive-or type operator.

9. The memory as claimed in claim 8, wherein for a field of data coded on k bits, in k-bit words, the said logical operator comprises k elementary exclusive-or operators in order to deliver the encrypted datum.

10. A read-protected semi-conductor memory, of read-only type comprising:
- a first program memory including a network of MOS transistors arranged in matrix of rows and columns, all transistors of a same column being coupled in series, the first of them the transistors in a column being connected to a bit line Bli, and gates of all transistors of a same row being connected to a word line;
- a second encryption memory comprising one column of MOS transistors of like type and identical in number to the number of transistors of any column of said first program memory, said MOS transistors being coupled in series, the first of said MOS transistors in a column being connected to an extra bit line dedicated for encryption, and the gates of MOS transistors of a given row being connected to a corresponding word line;
- a row selection circuit receiving row addresses, and determining word lines, in order to connect together all the gates of the MOS transistors of the first program memory, and all the gates of the MOS transistors of the second encryption memory, of the corresponding row;
- a decoder circuit receiving column addresses, for selecting one bit of first memory, and a circuit for biasing the selected bit line;
- a circuit for biasing the encryption bit line of a second memory; and
- a logical operator intercoupled with the selected bit line of the first memory and the encryption bit line of second memory, thereby allowing, on simultaneous reading of said program and encryption memories respectively, to obtain corresponding encrypted program data.

* * * * *